United States Patent [19]
Kusumoto et al.

[11] Patent Number: 5,828,717
[45] Date of Patent: Oct. 27, 1998

[54] TIME COUNTING CIRCUIT AND COUNTER CIRCUIT

[75] Inventors: Keiichi Kusumoto, Hyogo; Shiro Dosho; Yutaka Terada, both of Osaka; Akira Matsuzawa, Kyoto, all of Japan

[73] Assignee: Matsushita Electric Industrial Co. Ltd., Osaka, Japan

[21] Appl. No.: 624,960

[22] Filed: Mar. 27, 1996

[30] Foreign Application Priority Data

Mar. 28, 1995 [JP] Japan .................................. 7-069805

[51] Int. Cl.$^6$ .................................................. G01C 21/00
[52] U.S. Cl. .................................................. 377/24; 377/20
[58] Field of Search .................................... 327/20, 24

[56] References Cited

U.S. PATENT DOCUMENTS

| | | | |
|---|---|---|---|
| 4,370,067 | 1/1983 | Iwakura et al. | 377/20 |
| 4,908,784 | 3/1990 | Box et al. | 377/20 |
| 4,953,095 | 8/1990 | Ishikawa et al. | 377/20 |
| 5,166,959 | 11/1992 | Chu et al. | 377/20 |

OTHER PUBLICATIONS

T. Watanabe et al., "A Time–to–Digital Converter LSI", Technical Report of IEICE, pp. 37–43, Aug. 1993.

*Primary Examiner*—Margaret Rose Wambach
*Attorney, Agent, or Firm*—McDermott, Will & Emery

[57] ABSTRACT

There is provided a time counting circuit for measuring a pulse spacing of a pulse signal with high accuracy and with low power consumption.

An inverter ring composed of an odd number of inverters connected in a ring oscillates and one signal transition occurs after another as though seemingly circulating around the inverter ring. Holding circuits connected to respective output terminals of the inverters composing the inverter ring output, on the rising edge of a pulse signal to be measured, signals outputted from the inverters at the same time. The outputted signals are then converted by a signal converting circuit to numeric data. A counter circuit connected to the output terminal of one of the inverters composing the inverter ring counts the number of circulations of signal transition. A time-difference operating circuit corrects the numeric data outputted from the signal converting circuit based on the number of circulations of signal transition outputted from the counter circuit to provide time data, while calculating and outputting the pulse spacing of the pulse signal to be measured.

17 Claims, 12 Drawing Sheets

FIG. 2

| TIME | OUTPUT FROM INVERTER RING | INPUT TO ENCODER | OUTPUT FROM ENCODER |
|---|---|---|---|
| 0 | 0 1 0 1 0 ... 0 1 0 1 0 | 0 0 0 0 0 ... 0 0 0 0 0 | 0 0 0 0 0 0 |
| 1 | 1 1 0 1 0 ... 0 1 0 1 0 | 1 0 0 0 0 ... 0 0 0 0 0 | 0 0 0 0 0 1 |
| 2 | 1 0 0 1 0 ... 0 1 0 1 0 | 1 1 0 0 0 ... 0 0 0 0 0 | 0 0 0 0 1 0 |
| 3 | 1 0 1 1 0 ... 0 1 0 1 0 | 1 1 1 0 0 ... 0 0 0 0 0 | 0 0 0 0 1 1 |
| 4 | 1 0 1 0 0 ... 0 1 0 1 0 | 1 1 1 1 0 ... 0 0 0 0 0 | 0 0 0 1 0 0 |
| ⋮ | ⋮ | ⋮ | ⋮ |
| 29 | 1 0 1 0 1 ... 1 1 0 1 0 | 1 1 1 1 1 ... 1 0 0 0 0 | 0 1 1 1 0 1 |
| 30 | 1 0 1 0 1 ... 1 0 0 1 0 | 1 1 1 1 1 ... 1 1 0 0 0 | 0 1 1 1 1 0 |
| 31 | 1 0 1 0 1 ... 1 0 1 1 0 | 1 1 1 1 1 ... 1 1 1 0 0 | 0 1 1 1 1 1 |
| 32 | 1 0 1 0 1 ... 1 0 1 0 0 | 1 1 1 1 1 ... 1 1 1 1 0 | 1 0 0 0 0 0 |
| 33 | 1 0 1 0 1 ... 1 0 1 0 1 | 1 1 1 1 1 ... 1 1 1 1 1 | 0 0 0 0 0 0 |
| 34 | 0 0 1 0 1 ... 1 0 1 0 1 | 0 1 1 1 1 ... 1 1 1 1 1 | 0 0 0 0 0 1 |
| 35 | 0 1 1 0 1 ... 1 0 1 0 1 | 0 0 1 1 1 ... 1 1 1 1 1 | 0 0 0 0 1 0 |
| 36 | 0 1 0 0 1 ... 1 0 1 0 1 | 0 0 0 1 1 ... 1 1 1 1 1 | 0 0 0 0 1 1 |
| 37 | 0 1 0 1 1 ... 1 0 1 0 1 | 0 0 0 0 1 ... 1 1 1 1 1 | 0 0 0 1 0 0 |
| 38 | 0 1 0 1 0 ... 1 0 1 0 1 | 0 0 0 0 0 ... 1 1 1 1 1 | 0 0 0 1 0 1 |
| ⋮ | ⋮ | ⋮ | ⋮ |
| 62 | 0 1 0 1 0 ... 0 0 1 0 1 | 0 0 0 0 0 ... 0 1 1 1 1 | 0 1 1 1 0 1 |
| 63 | 0 1 0 1 0 ... 0 1 1 0 1 | 0 0 0 0 0 ... 0 0 1 1 1 | 0 1 1 1 1 0 |
| 64 | 0 1 0 1 0 ... 0 1 0 0 1 | 0 0 0 0 0 ... 0 0 0 1 1 | 0 1 1 1 1 1 |
| 65 | 0 1 0 1 0 ... 0 1 0 1 1 | 0 0 0 0 0 ... 0 0 0 0 1 | 1 0 0 0 0 0 |

FIG.3

| TIME | INVERTER | OUTPUT FROM COUNTER (UPPER BITS) | OUTPUT FROM ENCODER (LOWER BITS) | ADDITION VALUE | TIME DATA |
|---|---|---|---|---|---|
| 0 | 1 | 000000 | 0, 00000 | 000000 | 0, 000000, 00000 |
| 1 | 2 | | 0, 00001 | | 0, 000000, 00001 |
| 2 | 3 | | 0, 00010 | | 0, 000000, 00010 |
| ⋮ | ⋮ | | ⋮ | | ⋮ |
| 30 | 31 | | 0, 11110 | | 0, 000000, 11110 |
| 31 | 32 | | 0, 11111 | | 0, 000000, 11111 |
| 32 | 33 | ↓ | 1, 00000 | ↓ | 0, 000001, 00000 |
| 33 | 1 | 000001 | 0, 00000 | 000001 | 0, 000001, 00001 |
| 34 | 2 | | 0, 00001 | | 0, 000001, 00010 |
| 35 | 3 | | 0, 00010 | | 0, 000001, 00011 |
| ⋮ | ⋮ | | ⋮ | | ⋮ |
| 63 | 31 | | 0, 11110 | | 0, 000001, 11111 |
| 64 | 32 | | 0, 11111 | | 0, 000010, 00000 |
| 65 | 33 | ↓ | 1, 00000 | ↓ | 0, 000010, 00001 |
| 66 | 1 | 000010 | 0, 00000 | 000010 | 0, 000010, 00010 |
| 67 | 2 | | 0, 00001 | | 0, 000010, 00011 |
| 68 | 3 | | 0, 00010 | | 0, 000010, 00100 |
| ⋮ | ⋮ | | ⋮ | | ⋮ |
| 96 | 31 | | 0, 11110 | | 0, 000011, 00000 |
| 97 | 32 | | 0, 11111 | | 0, 000010, 00001 |
| 98 | 33 | ↓ | 1, 00000 | ↓ | 0, 000010, 00010 |
| ⋮ | ⋮ | ⋮ | ⋮ | ⋮ | ⋮ |
| 1023 | 1 | 011111 | 0, 00000 | 011111 | 0, 011111, 11111 |
| 1024 | 2 | | 0, 00001 | | 0, 100000, 00000 |
| ⋮ | ⋮ | | ⋮ | | |
| 1053 | 31 | | 0, 11110 | | 0, 100000, 11101 |
| 1054 | 32 | | 0, 11111 | | 0, 100000, 11110 |
| 1055 | 33 | ↓ | 1, 00000 | ↓ | 0, 100000, 11111 |
| 1056 | 1 | 100000 | 0, 00000 | 100000 | 0, 100001, 00000 |
| 1057 | 2 | | 0, 00001 | | 0, 100001, 00001 |
| ⋮ | ⋮ | | ⋮ | | |
| 1086 | 31 | | 0, 11110 | | 0, 100001, 11110 |
| 1087 | 32 | | 0, 11111 | | 0, 100001, 11111 |
| 1088 | 33 | ↓ | 1, 00000 | ↓ | 0, 100010, 00000 |
| ⋮ | ⋮ | ⋮ | ⋮ | ⋮ | ⋮ |
| 2046 | 1 | 111110 | 0, 00000 | 111110 | 0, 111111, 11110 |
| 2047 | 2 | | 0, 00001 | | 0, 111111, 11111 |
| ⋮ | ⋮ | | ⋮ | | |
| 2076 | 31 | | 0, 11110 | | 1, 000000, 11100 |
| 2077 | 32 | | 0, 11111 | | 1, 000000, 11101 |
| 2078 | 33 | ↓ | 1, 00000 | ↓ | 1, 000000, 11110 |
| 2079 | 1 | 111111 | 0, 00000 | 111111 | 1, 000000, 11111 |
| 2080 | 2 | | 0, 00001 | | 1, 000001, 00000 |
| ⋮ | ⋮ | | ⋮ | | |
| 2109 | 31 | | 0, 11110 | | 1, 000001, 11101 |
| 2110 | 32 | | 0, 11111 | | 1, 000001, 11110 |
| 2111 | 33 | ↓ | 1, 00000 | ↓ | 1, 000001, 11111 |

WHEN 1ST PULSE HOLDS TIME T BETWEEN 1ns AND 2ns

| 2 ND PULSE | 3 RD PULSE | 4 TH PULSE | RESULT |
|---|---|---|---|
| 3 > | 3 > | 3 > | $1.0 \leq T \leq 1.25$ |
| 3 > | 3 > | 3 < | $1.25 \leq T \leq 1.5$ |
| 3 > | 3 < | 3 < | $1.5 \leq T \leq 1.75$ |
| 3 < | 3 < | 3 < | $1.75 \leq T \leq 2.0$ |

TIME COUNTING CIRCUIT AND COUNTER CIRCUIT

BACKGROUND OF THE INVENTION

The present invention relates to time counting circuit for measuring such time as the pulse spacing of a pulse signal and to counter circuits.

Time counting circuits for measuring such time as the pulse spacing of a pulse signal have been made frequent use of in the field of digital communication and the like. In recent years, it has become possible to mount a time counting circuit composed of a CMOS transistor in conjunction with other digital circuits on a single chip, which has accomplished a significant reduction in the cost of manufacturing semiconductor devices.

A time counting circuit which exhibits further stabilized operation with higher accuracy may also find extensive application in various fields including the modulation of FM signals and the demodulation of bus signals in an LSI. If a time counting circuit capable of measuring an extremely short time with accuracy and stability can be utilized for the demodulation of bus signals in an LSI, the number of buses in the LSI can be reduced significantly.

FIG. 12 shows an example of the structure of a conventional time counting circuit, in which are shown: an inverter ring (IR) 51; a row of holding circuits 52; signal converting means 53; time-difference operating circuit 54; a counter 55a; and a counter-output holding circuit 55b. A pulse-signal input terminal receives a pulse signal to be measured and an operation-result output terminal outputs time corresponding to the pulse spacing of the inputted pulse signal.

The time counting circuit shown in FIG. 12 includes the inverter ring 51 composed of a plurality of delay circuits each consisting of two inverters and one delay circuit consisting of three inverters (the final delay circuit in FIG. 12), which are connected in a ring. Since the inverter ring 51 is composed of the odd number of inverters, so-called oscillation is observed whereby one signal transition occurs after another as though seemingly moving along the inverter ring 51 with the passage of time, resulting in circulations around the inverter ring 51. Therefore, time can be measured by examining variations in the output voltages from the respective delay circuits.

The output voltages from the respective delay circuits composing the inverter ring 51 are held in flip-flops (FFs) composing the row of holding circuits 52. When the pulse to be measured rises, it is outputted to the signal converting means 53, which converts the output voltage from each of the delay circuits to data and outputs it to the time-difference operating circuit 54. The counter 55a counts the number of circulations of signal transition around the inverter ring 51 and outputs count data to the time-difference operating circuit 54 via the counter-output holding circuit 55b (see "Time-to-Digital Converter LSI" Technical Report of IEICE, ICD93-77 (1993-08)).

However, the conventional time counting circuit has the following disadvantages.

To achieve oscillation in the inverter ring, an odd number of inverters should necessarily be provided therein. To simplify the structure of the subsequent operating circuit, a power-of-two number of delay circuits are preferably included in the inverter ring. Accordingly, the inverter ring of the conventional time counting circuit comprises delay circuits of different structures, as shown in FIG. 12.

However, it is difficult to equalize signal delay times for all the delay circuits composing the inverter ring because of their different structures. Even if the inverter ring is designed so that signal delay times for all the delay circuits become equal, signal delay times may vary differently for the delay circuits of different structures when a power-source voltage varies. Hence, the conventional time counting circuit is disadvantageous in that linearity is not ensured for the relationship between measured time data and real time.

On the other hand, the counter which counts the number of circulations of signal transition around the inverter ring performs the operation of adding 1 to the output data every time the input signal changes. Since the adding operation requires a given period of time, correct data cannot be outputted when the pulse signal to be measured rises during the given period of time and the row of counter-output holding circuits connected to the counter initiate holding operation, resulting in the occurrence of an error. The error would exert a crucial influence that cannot be ignored on the accuracy with which time data is measured, since the output data from the counter occupies the upper bits of the time data.

Moreover, the influence of the error becomes far more serious in a field to which the present inventors are examining the application of time counting circuits than in a conventional application field, since a time counting circuit in which a delay time per delay circuit is 1 ns or less is in demand in the application field under examination, while the adding operation of the counter requires a minimum time on the order of 5 ns.

The conventional time counting circuit also has the following disadvantage.

The inverter ring, which functions as an oscillator, consumes a large amount of power so that the number of the delay circuits included therein should be minimized in order to lower power consumption. On the other hand, since the time resolution of the conventional time counting circuit is determined by the signal delay time for each of the delay circuits composing the inverter, it is necessary to reduce the signal delay time per delay circuit in order to further improve the time resolution.

If the number of the delay circuits is reduced to lower power consumption, the time required for one circulation of signal transition is also reduced. If the signal delay time is reduced in order to improve the time resolution, on the other hand, the time required for one circulation of signal transition is also reduced. However, in the case where the time required for one circulation of signal transition is reduced excessively, the counter cannot perform the operation of counting the number of circulations in time.

Thus, the conventional time counting circuit is disadvantageous in that the number of the delay circuits can be reduced only to the extent that the counter reliably performs the operation of counting the number of circulations, which poses limitations to the degree to which power consumption is lowered. In the case of reducing the signal delay time, on the other hand, an improvement in time resolution causes an unfavorable increase in power consumption, since it becomes necessary to increase the number of the delay circuits so as not to excessively reduce the time required for one circulation of signal transition.

SUMMARY OF THE INVENTION

It is therefore an object of the present invention to provide a high-accuracy, low-power time counting circuit.

To overcome the problems mentioned above, a time counting circuit according to the present invention comprises: a delay circuit ring composed of delay circuits having identical structures, the above time counting circuit having the function of correcting numeric data obtained from an output signal from the above delay circuit ring so as to facilitate operation for time data. The arrangement equalizes signal delay times for the respective delay circuits in the time counting circuit, so that accuracy of time measurement is improved and operation for time data is performed as easily as is performed by a conventional time counting circuit.

Alternatively, the time counting circuit according to the present invention comprises: a delay circuit ring composed of a plurality of delay circuits around which signal transition is caused to circulate by oscillation; and a plurality of counter circuits for counting the numbers of signal transitions at respective output terminals of the delay circuits composing the above delay circuit ring, wherein one of the above plurality of counter circuits is selected based on a current position of signal transition in the above delay circuit ring so as to provide the number of circulations of signal transition around the above delay circuit ring based on count data from the selected counter circuit. The arrangement prevents the occurrence of an error in circulation number data, resulting in improved accuracy of time measurement.

Alternatively, the time counting circuit according to the present invention comprises: a delay circuit ring composed of a plurality of delay circuits around which signal transition is caused to circulate by oscillation; and plural rows of holding circuits each composed of a plurality of holding circuits connected to respective output terminals of the delay circuits composing the above delay circuit ring, the above rows of holding circuits outputting signals at the output terminals of the delay circuits to which the respective holding circuits are connected on a rising edge of an inputted pulse signal, wherein each row of holding circuits receive a pulse signal to be measured and other pulse signals having respective time differences with the pulse signal to be measured, the above time counting circuit providing time data based on the signals outputted from the respective rows of holding circuits. The arrangement improves time resolution without reducing the signal delay time for each of the delay circuits.

Alternatively, the time counting circuit according to the present invention comprises: a delay circuit ring composed of a plurality of delay circuits around which signal transition is caused to circulate by oscillation; and a counter circuit for counting the number of signal transitions at an output terminal of one of the delay circuits composing the above delay circuit ring as the number of circulations of signal transition around the above delay circuit ring, wherein the above counter circuit has a plurality of counters so as to generate, based on a signal at the output terminal of the above one delay circuit, a plurality of signals having periods longer than a period of the above signal and respective time differences with the above signal, to count transitions of the generated signals by means of the respective counters, and to provide the number of circulations of signal transition around the above delay circuit ring based on count data from each of the counters. The arrangement lessens requirements on time for one circulation of signal transition around the delay circuit ring.

BRIEF DESCRIPTION OF THE DRAWINGS

FIG. 2 shows an output signal from an inverter ring 11, an input signal to an encoder 13b, and output data from the encoder 13b in each time;

FIG. 3 shows time data obtained as a result of data correction performed by a time-difference operating circuit 14;

FIGS. 9A and 9B illustrate a method of operation for time data in the time counting circuit according to the third embodiment of the present invention, of which FIG. 9(a) shows different timing for first to fourth pulses and FIG. 9(b) shows a method of judging time data;

DETAILED DESCRIPTION OF THE INVENTION

Below, a time counting circuit according to each embodiment of the present invention will be described with reference to the drawings.

(First Embodiment)

Figure 1:
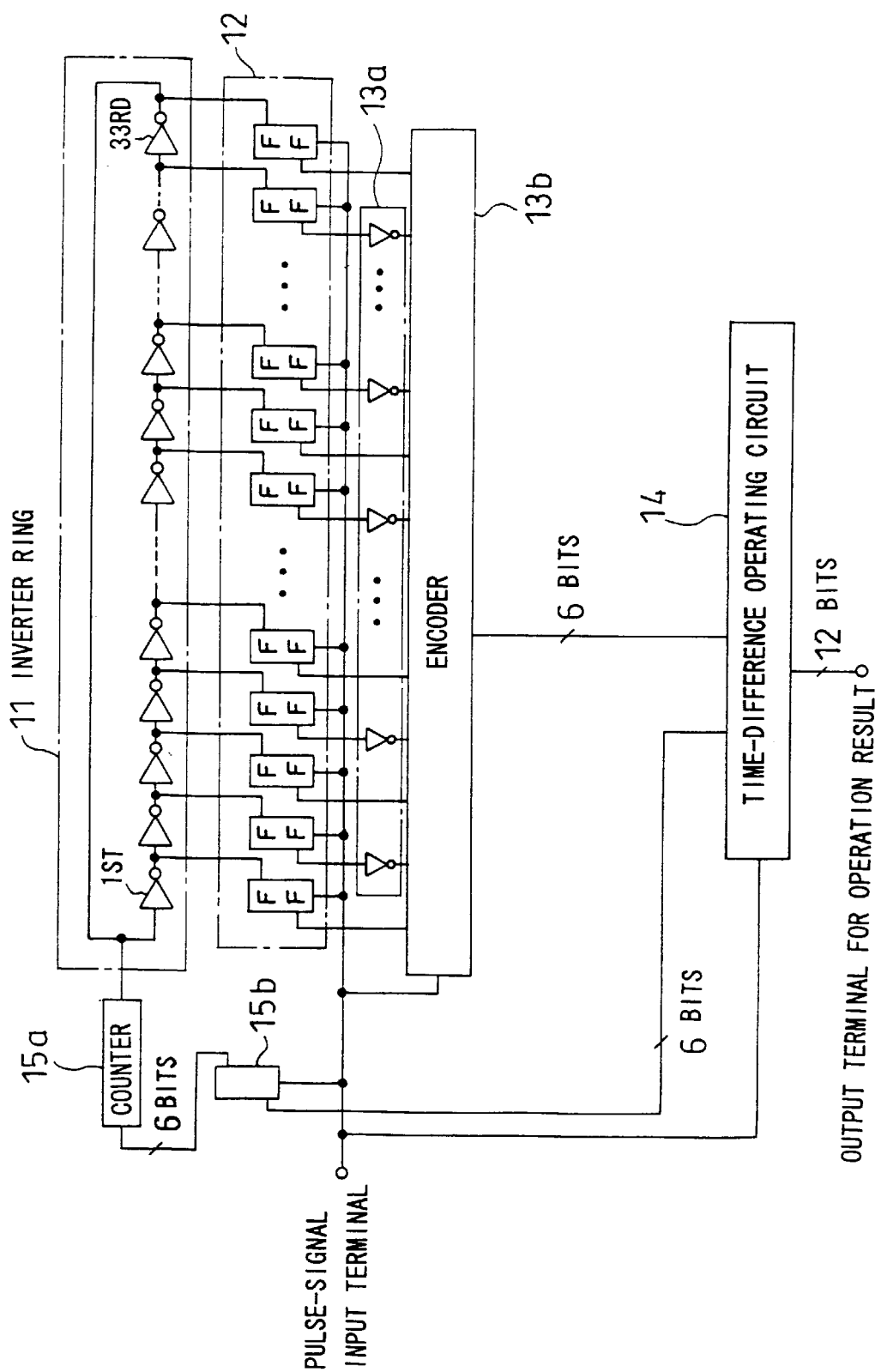
FIG. 1 shows the structure of a time counting circuit according to a first embodiment of the present invention.

FIG. 1 shows the structure of a time counting circuit according to a first embodiment of the present invention, in which are shown: an inverter ring (IR) 11 as a delay circuit ring; a row of holding circuits 12; a row of inverting circuits 13a; an encoder 13b; a time-difference operating circuit 14; a counter 15a; and a counter-output holding circuit 15b. The row of inverting circuits 13a and the encoder 13b constitute signal converting means, while the counter 15a and the counter-output holding circuit 15b constitute a counter circuit. A pulse-signal input terminal receives a pulse signal to be measured, while an operation-result output terminal outputs time corresponding to the pulse spacing of the inputted pulse signal.

The inverter ring 11 consists of 33 ($=2^5+1$) inverters having equal signal delay times, which are connected in a ring. Specifically, the 1st to 33rd inverters are connected in series and an output terminal of the 33rd inverter is connected to an input terminal of the 1st inverter. The row of holding circuits 12 consist of thirty-three flip-flops (FFs) connected to the respective output terminals of all the inverters composing the inverter ring 11, which indicates that each delay circuit is implemented by one inverter. To each of the flip-flops is inputted the pulse signal to be measured.

The row of inverting circuits 13a consist of sixteen inverting circuits connected to respective output signal lines of the flip-flops connected to the even-numbered inverters of the inverter ring 11. The encoder 13b receives output signals directly from these ones of the flip-flops constituting the row of holding circuits 12 which are connected to the odd-numbered inverters of the inverter ring 11, while receiving output signals from the flip-flops connected to the even-numbered inverters via the inverting circuits constituting the row of inverting circuits 13a, and outputs 6-bit numeric data.

The counter 15a is connected to the output terminal of the 33rd inverter (input terminal of the 1st inverter) of the inverter ring 11. The counter-output holding circuit 15b holds the 6-bit count data outputted from the counter 15a.

The time-difference operating circuit 14 receives the 6-bit numeric data outputted from the encoder 13b and 6-bit count data outputted from the counter-output holding circuit 15b and outputs 12-bit time data.

Referring now to FIGS. 2 and 3, a detailed description will be given to the operation of the time counting circuit shown in FIG. 1.

Each of the inverters constituting the inverter ring 11 inverts an input signal and outputs the inverted input signal after a given delay time has elapsed. Since the odd number of inverters are connected in a ring, so-called oscillation is observed whereby one signal transition occurs after another as though seemingly moving along the inverter ring 11 with the passage of time, resulting in circulations around the inverter ring 11.

FIG. 2 shows the transition of an output signal from the inverter ring 11 with the passage of time and an input signal to the encoder 13b and output data therefrom when a pulse signal to be measured rises during each time. In the drawing, the HIGH and LOW levels of the output signal from the inverter and of the input signal to the encoder 13b are represented by "1" and "0", respectively. An increment of time represents a signal delay time for one inverter, which is assumed to be 1 ns.

Here (TIME 0), it is assumed that the output voltages from all the odd-numbered inverters are on the LOW level and that the output voltages from all the even-numbered inverters are on the HIGH level. In this case, only the output voltages from the 33rd and 1st inverters are observed consecutively on the same level. When 1 ns has elapsed (TIME 1), the output voltage from the 1st inverter shifts from the LOW level to the HIGH level since the input voltage thereto (i.e., the output voltage from the 33rd inverter) is on the LOW level. The output voltages from the other odd-numbered inverters remain on the LOW level, while the output voltages from the even-numbered inverters remain on the HIGH level. In this case, only the output voltages from the 1st and 2nd inverters are observed consecutively on the same level.

When another 1 ns has elapsed (TIME 2), the output voltage from the 2nd inverter shifts from the HIGH level to the LOW level since the input voltage thereto (i.e., the output voltage from the 1st inverter) is on the HIGH level. The output voltages from the other even-numbered inverters and the output voltage from the 1st inverter remain on the HIGH level, while the output voltages from the odd-numbered inverters other than the 1st inverter remain on the LOW level. In this case, only the output voltages from the 2nd and 3rd inverters are observed consecutively on the same level. In this manner, signal transition proceeds by one inverter every time 1 ns has elapsed.

Each of the flip-flops constituting the row of holding circuits 12 holds a signal at the output terminal of each of the inverters composing the inverter ring 11. When the pulse signal to be measured rises, each flip-flop outputs the signal held therein at the same time. The flip-flops connected to the odd-numbered inverters output signals directly to the encoder 13b. The flip-flops connected to the even-numbered inverters output signals to the inverting circuits constituting the row of inverting circuits 13a, which invert the input signals and output the inverted input signals to the encoder 13b.

The input signals to the encoder 13b on the rising edge of the pulse signal to be measured are as shown in the middle column of FIG. 2. If the pulse signal rises during TIME 0, for example, all the input signals are on the LOW level. If the pulse signal rises during TIME 1, only the first input signal is on the HIGH level and the other input signals are on the LOW level. The encoder 13b outputs, based on the input signals, the 6-bit data representing 33 tones from "000000" to "100000" (hereinafter referred to as lower-bit data) as shown in the rightmost column of FIG. 2.

The counter 15a counts the number of signal transitions at the output terminal of the 33rd inverter. When signal transition has made one circulation around the inverter ring 11 (TIME 33), the output voltage from the 33rd inverter shifts from the LOW level to the HIGH level, so that the counter 15a adds 1 to the count data. The counter-output holding circuit 15b holds the 6-bit data outputted from the counter 15a and outputs the 6-bit data held therein (hereinafter referred to as upper-bit data) on the rising edge of the pulse signal to be measured.

The lower-bit data outputted from the encoder 13b represents the current position of signal transition in the inverter ring 11 and the upper-bit data outputted from the counter 15a represents the number of circulations of signal transition. Hence, the time data representing the time at which the pulse signal to be measured rises can be obtained from the above two sets of data.

However, the lower-bit data merely combined with the upper-bit data cannot form the 12-bit time data. This is because, since the lower-bit data is represented by values from "000000" to "100000", the lower-bit data merely combined with the upper-bit data form discontinuous time data. To facilitate the calculation of time difference, the time data is required to be continuous, so that some type of data correction becomes necessary, which is performed by the time-difference operating circuit 14.

FIG. 3 shows time data obtained through data correction performed by the time-difference operating circuit 14. A description will be given below to the method of data correction. First, values equal to those of the upper-bit data outputted from the counter 15a are defined as addition values. The addition values are added to the lower-bit data outputted from the encoder 13b. The upper-bit data is further multiplied by $2^5$ (five bits of "0" are connected to the least significant bit of the upper-bit data) and the result of the addition previously performed is added thereto. The 12-bit data thus obtained through the operation is defined as the time data.

It will be appreciated from FIG. 3 that the time data representing continuous 2112 (33 stages×$2^6$) tones can be provided by the time counting circuit according to the present embodiment. The pulse spacing can be measured using the time data in the same manner as measured by the conventional time counting circuit.

Since the data correction performed by the time-difference operating circuit 14 can be performed through the addition and multiplication by some power-of-2 number, it can be implemented by a circuit extremely small in size.

(Second Embodiment)

Figure 4:
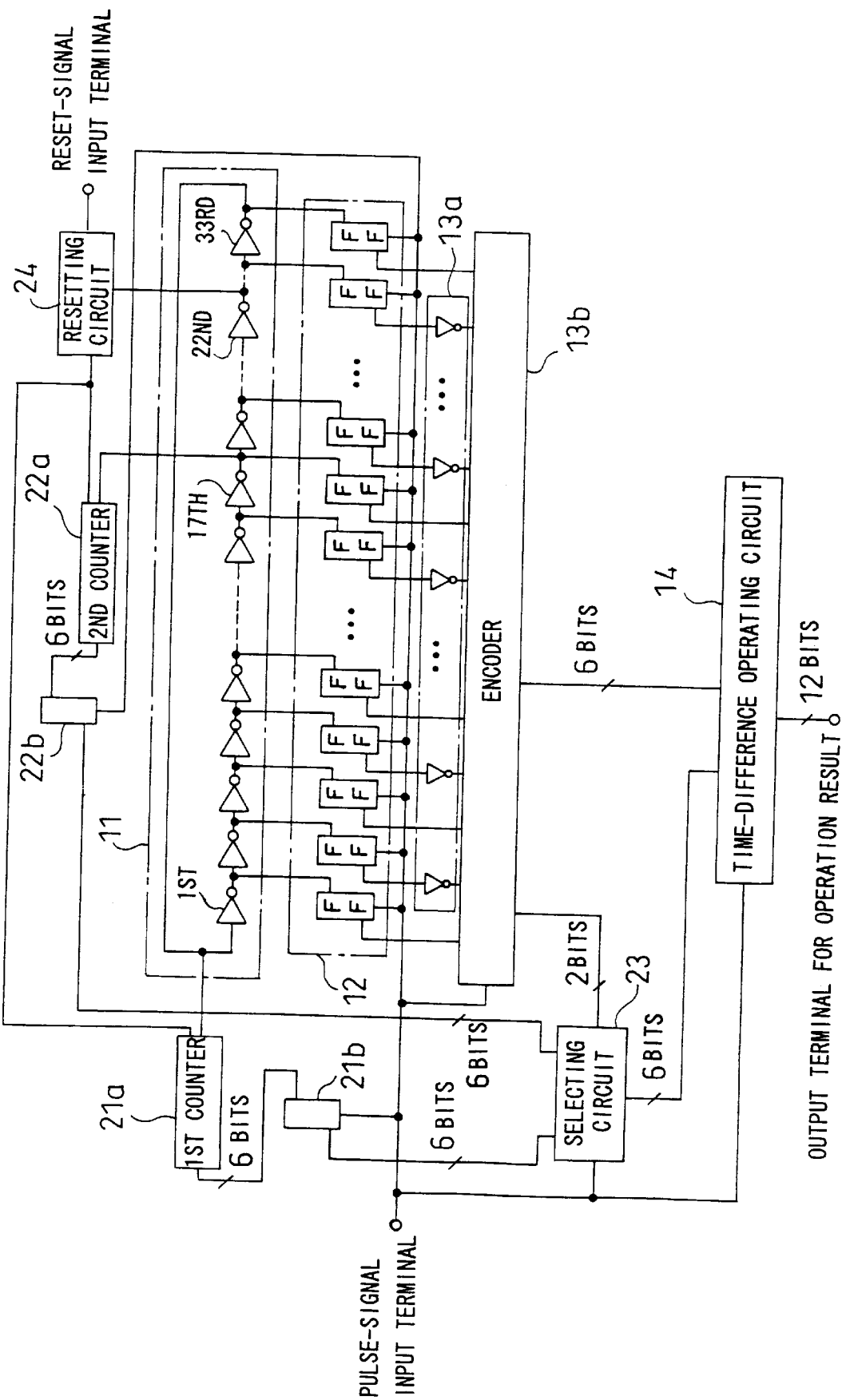
FIG. 4 shows the structure of a time counting circuit according to a second embodiment of the present invention.

FIG. 4 shows the structure of a time counting circuit according to a second embodiment of the present invention, in which are shown: an inverter ring (IR) 11 as a delay circuit ring; a row of holding circuits 12; a row of inverting circuits 13a; an encoder 13b; a time-difference operating circuit 14; a first counter 21a; a first-counter-output holding circuit 21b; a second counter 22a; a second-counter-output holding circuit 22b; a selecting circuit 23; and a resetting circuit 24. The row of inverting circuits 13a and the encoder 13b constitute signal converting means. The first counter 21a and the first-counter-output holding circuit 21b constitute a first counter circuit, while the second counter 22a and the second-counter-output holding circuit 22b constitute a second counter circuit. A pulse-signal input terminal receives a pulse signal to be measured. An operation-result output terminal outputs time corresponding to the pulse spacing of the inputted pulse signal. A reset-signal input terminal receives a reset signal for resetting the first and second counters 21a and 22a.

As for the inverter ring (IR) 11, row of holding circuits 12, row of inverting circuits 13a, and time-difference operating circuit 14, they operate in the same manner as in the time counting circuit according to the first embodiment, so that the description thereof is omitted in the present embodiment.

The encoder 13b operates in the same manner as in the first embodiment in that it outputs 6-bit lower-bit data based on an input signal. In addition, the encoder 13b outputs a 2-bit select signal which will be described later.

The first counter 21a is connected to the output terminal of the 33rd inverter (input terminal of the 1st inverter) of the inverter ring 11. The first-counter-output holding circuit 21b holds 6-bit count data outputted from the first counter 21a.

The second counter 22a is connected to the output terminal of the 17th inverter (input terminal of the 18th inverter) of the inverter ring 11. The second-counter-output holding circuit 22b holds 6-bit count data outputted from the second counter 22a.

The selecting circuit 23 selects, based on the 2-bit select signal outputted from the encoder 13b, either one of the 6-bit count data outputted from the first-counter-output holding circuit 21b and the 6-bit count data outputted from the second-counter-output holding circuit 22b and outputs the selected one as the upper-bit data to the time-difference operating circuit 14.

The resetting circuit 24 is connected to the output terminal of the 22nd inverter (input terminal of the 23rd inverter) of the inverter ring 11 and outputs, based on the reset signal received from the outside, a signal for resetting the counts of the first and second counters 21a and 22a.

Figure 5:
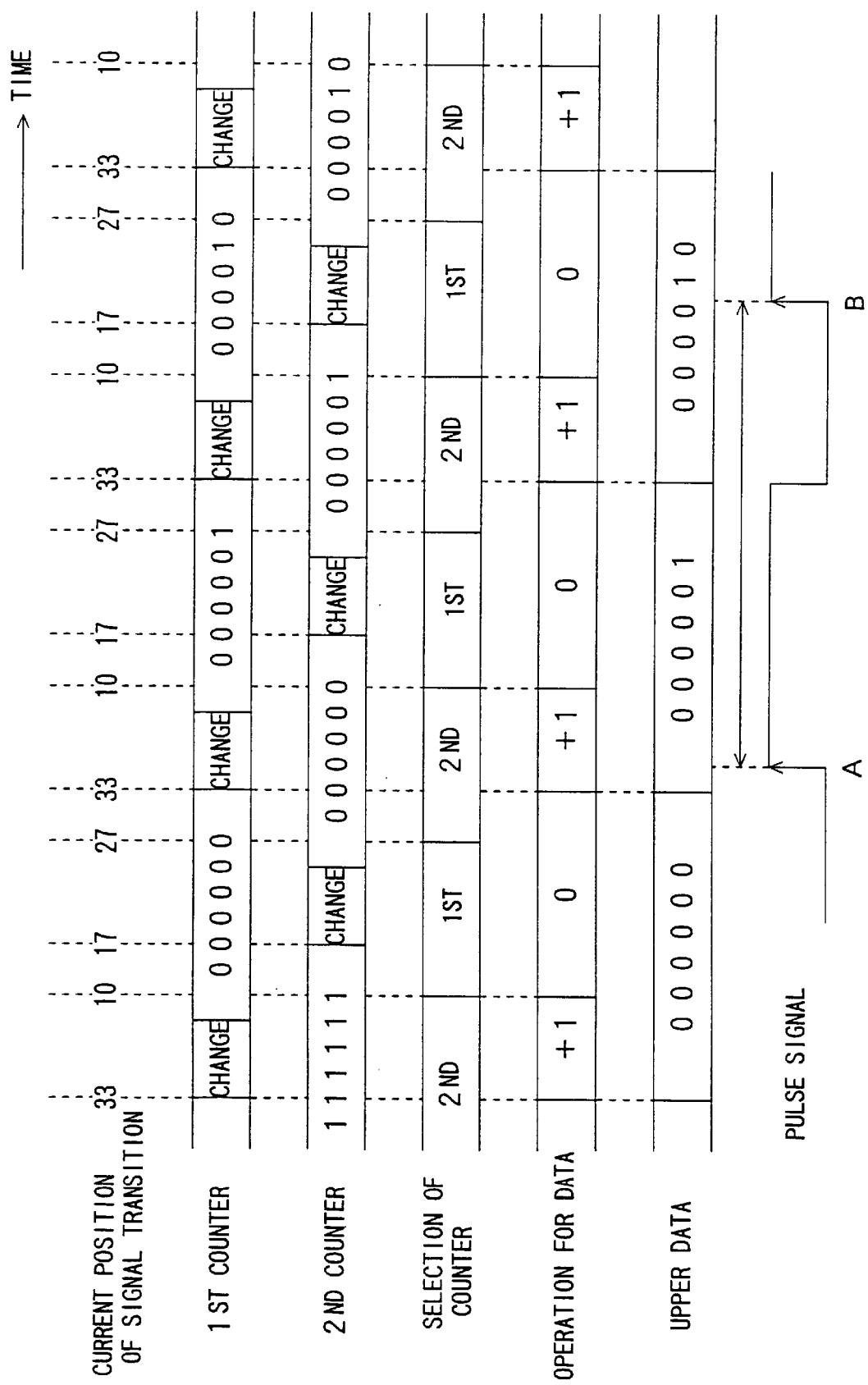
FIG. 5 illustrates the operations of first and second counters and of a selecting circuit in the time counting circuit according to the second embodiment of the present invention.
Figure 6:
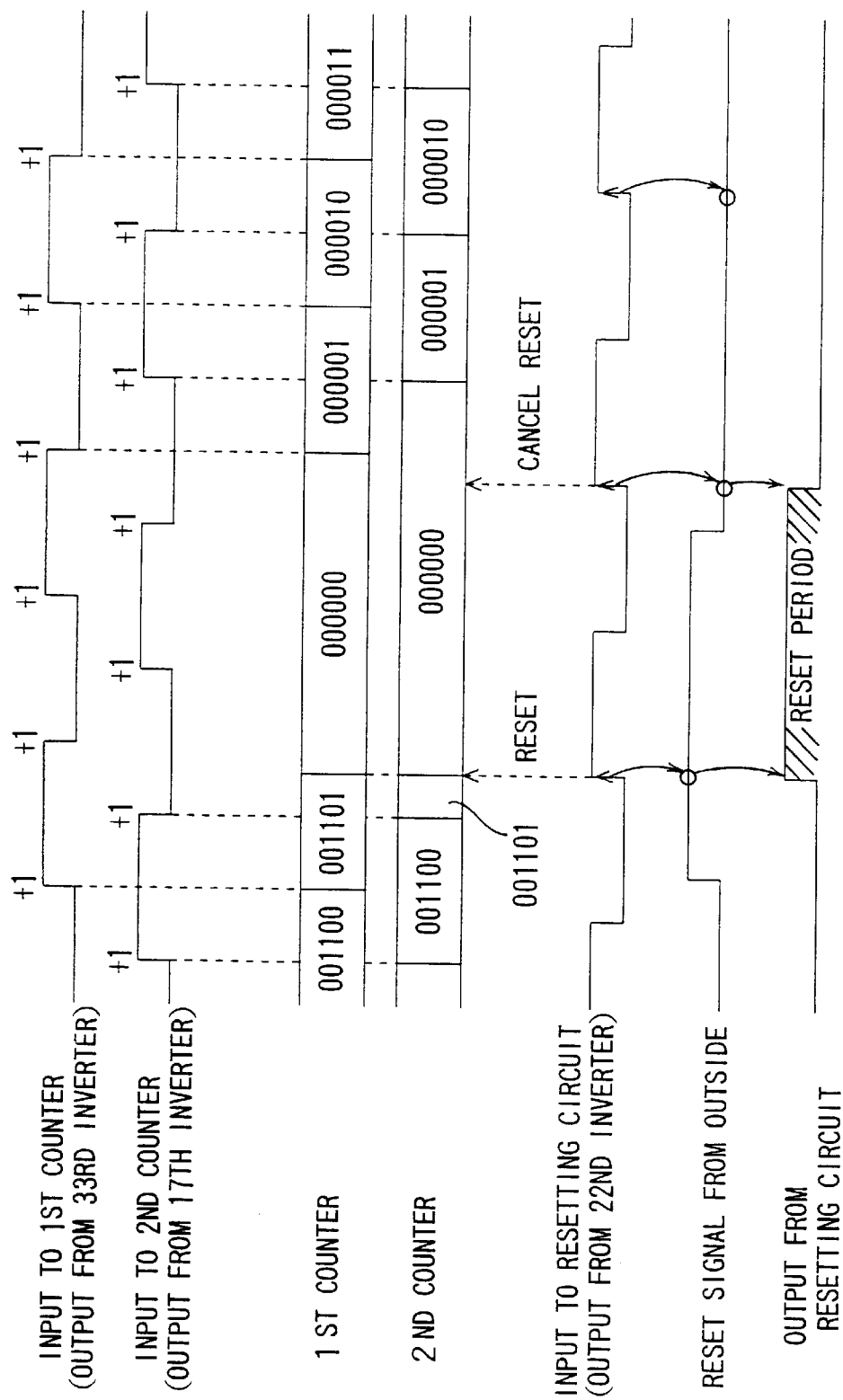
FIG. 6 illustrates the operation of a resetting circuit in the time counting circuit according to the second embodiment of the present invention.

Referring now to FIGS. 5 and 6, a detailed description will be given to the operation of the time counting circuit shown in FIG. 4.

FIG. 5 illustrates the operations of the first and second counters 21a and 22a and of the selecting circuit 23.

First, the first counter 21a initiates adding operation when the output signal from the 33rd inverter changes and generates stabilized output data after a given period of time has elapsed. The second counter 22a initiates adding operation when the output signal from the 17th inverter changes and generates stabilized output data after a given period of time has elapsed.

Of the two bits in the select signal outputted from the encoder 13b, the lower bit is a signal directing selection between the counters and the upper bit is a signal indicating whether or not the count data from the selected counter should be corrected. The selecting circuit 23 selects, based on the lower bit of the select signal, that one of the counters which generates more stabilized output data. To avoid malfunction due to a mishold in the row of holding circuits 12, the first counter 21a is selected when signal transition is occurring at any one of the output terminals of the 10th to 27th inverters in the inverter ring 11, while the second counter 22a is selected in the other cases.

A description will be given to the mishold in the row of holding circuits 12.

A flip-flop is a circuit which holds an input signal in the form of a so-called logic voltage of "0" or "1". Even if the input signal has an intermediate value between "0" and "1", either one of the logic voltages is held in the flip-flop. There may be cases where each of the probability of holding "0" and the probability of holding "1" has a finite value depending on the level of the input signal. Here, the range of such a signal level is termed an indefinite region.

A signal transition from "0" to "1" or "1" to "0" at the output terminal of each of the inverters composing the inverter ring 11 requires a given period of time. The timing with which the pulse signal to be measured rises is irrelevant to the signal transition at the output terminal of each inverter. Consequently, when the pulse signal to be measured rises and each of the flip-flops constituting the row of holding circuits 12 initiates holding operation, there may be cases where the level of the signal at the output terminal of the inverter falls within the indefinite region, so that an error may occur in the reading of the current position of signal transition.

When the signals at the output terminals of the 1st to 5th inverters shift from "01010" (TIME 0) to "11010" (TIME 1), for example, if the pulse signal to be measured rises while the levels of the signals at the output terminals of the 1st and 2nd inverters fall within the indefinite region, there is a given probability that the row of holding circuits 12 output "00010", which is termed a mishold. Although the encoder 13b corrects the data in that case, an error on the order of 4 to 5 ns may occur, if the delay time for one inverter is 1 ns, in the total delay time for several inverters.

The selecting circuit 23 is designed to switch between the counters at a time sufficiently before each counter initiates adding operation so that the counter which generates more stabilized output data can be selected even when a mishold occurs in the row of holding circuits 12.

When signal transition is currently occurring at any of the output terminals of the 33rd to 10th inverters, the selecting circuit 23 selects the second counter 22a and adds 1 to the count data based on the upper bit of the select signal. This is because the count data should be corrected since counting by the second counter 22a lags behind counting by the first counter 21a.

A description will be given to specific operations of the selecting circuit 23 and time-difference operating circuit 14 with reference to the case where the pulse spacing of a pulse signal shown in FIG. 5 is calculated. On the rising edge A, the current position of signal transition has assumedly reached the output terminal of the 2nd inverter and "000010" is outputted as the lower-bit data from the encoder 13b. On the rising edge B, the current position of signal transition has assumedly reached the output terminal of the 19th inverter and "010011" is outputted as the lower-bit data from the encoder 13b.

On the rising edge A, the second counter 22a is selected and 1 is added to the count data in the selecting circuit 23. As a result, "000001" is outputted as the upper-bit data to the time-difference operating circuit 14. On the rising edge B, the first counter 21a is selected and nothing is added to the count data. As a result, "000010" is outputted as the upper-bit data to the time-difference operating circuit 14.

The time-difference operating circuit 14 provides time data in the same manner as in the first embodiment. The time data on the rising edge A becomes "0,000001,00011", while the time data on the rising edge B becomes "0,000010, 10101". The time difference becomes "0,000001,10010"=50 (decimal number), so that a pulse spacing of 50 ns is provided if the signal delay time for one inverter is assumed to be 1 ns.

The resetting circuit 24 operates consistently on the precondition that counting by the first counter 21a precedes counting by the second counter 22a irrespective of the timing with which a reset signal is inputted thereto.

FIG. 6 illustrates the operation of the resetting circuit 24.

The first counter 21a counts the changing of an output signal from the 33nd inverter, while the second counter 22a counts the changing of an output signal from the 17th inverter. The resetting circuit 24 receives an output signal from the 22nd inverter.

When the output signal from the 22nd inverter rises, the resetting circuit 24 examines whether the reset signal from the outside is on the HIGH or LOW level. If the reset signal is on the HIGH level, the resetting circuit 24 generates an output signal on the HIGH level to the counter. If the reset signal is on the LOW level, on the other hand, the resetting circuit 24 generates an output signal on the LOW level to the counter.

When the output signal from the resetting circuit 24 rises, the first and second counters 21a and 22a are reset so that the output data from each of the counters becomes "000000". When the output signal from the resetting circuit 24 falls, the resetting is cancelled so that the first and second counters 21a and 22a start counting again. Since the timing with which the resetting is cancelled coincides with the timing with which the output signal from the 22nd inverter rises, the first counter 21a invariably starts counting ahead of the second counter 22a. Consequently, counting by the first counter 21a precedes counting by the second counter 22a irrespective of the timing with which the reset signal is inputted from the outside.

Figure 7:
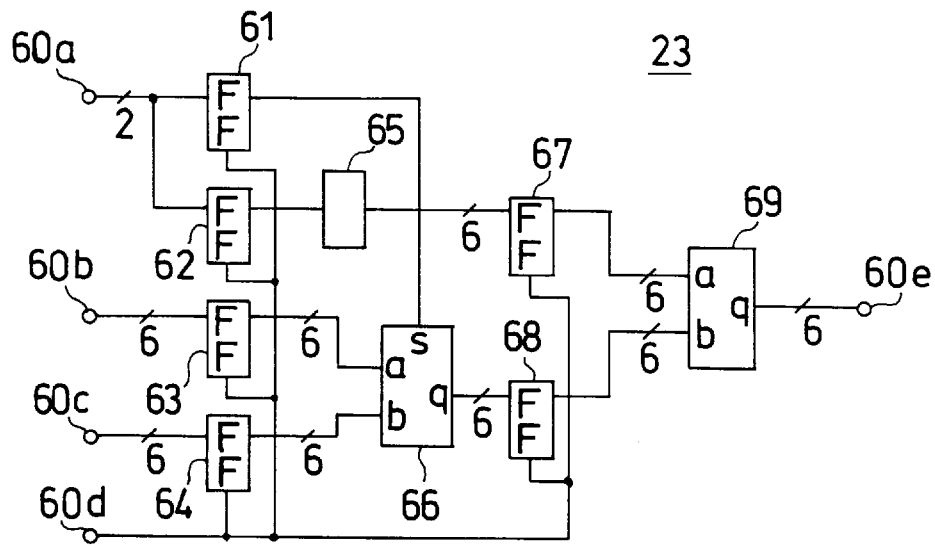
FIGS. 7(a) and 7(b) are circuit diagrams showing the internal structures of the selecting circuit 23 and of the time-difference operating circuit 14 in the time counting circuit shown in FIG. 4.
Figure 7:
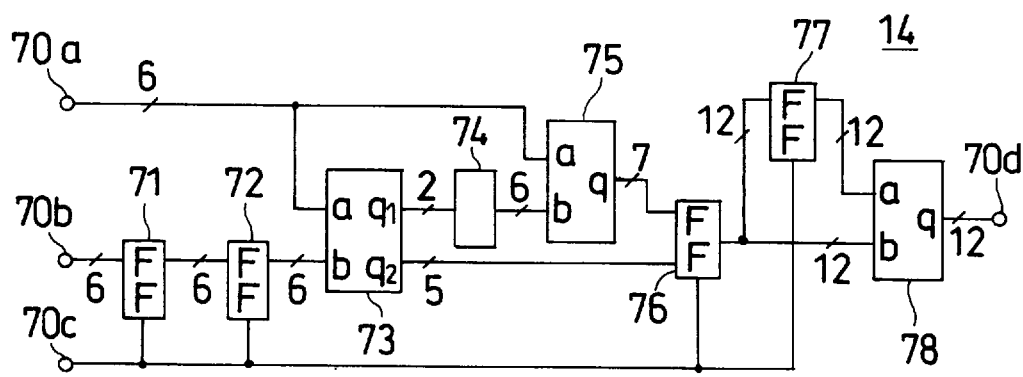

FIGS. 7(a) and 7(b) are circuit diagrams showing respective internal structures of the selecting circuit 23 and time-difference operating circuit 14 in the time counting circuit shown in FIG. 4.

In FIG. 7(a) are shown: an input terminal 60a for receiving the select signal outputted from the encoder 13b; an input terminal 60b for receiving the 6-bit count data outputted from the first-counter-output holding circuit 21b; an input terminal 60c for receiving the 6-bit count data outputted from the second-counter-output holding circuit 22b; an input terminal 60d for receiving the pulse signal to be measured; and an output terminal 60e from which the count data is outputted.

In the drawing are also shown: 1-bit flip-flops 61 and 62; and 6-bit flip-flops 63, 64, 67, and 68. Of the 2-bit select signal received by the input terminal 60a, the lower bit directing selection between the counters is inputted to the flip-flop 61, while the upper bit indicating whether or not the count data should be corrected is inputted to the flip-flop 62. A data converting circuit 65 outputs 6-bit data in which the least significant bit is occupied by the inputted 1-bit data and the upper 5 bits are "0". A selector circuit 66 selectively outputs either the output data from the flip-flop 63 or the output data from the flip-flop 64 based on the output signal from the flip-flop 61. An adder 69 adds up the output data from the flip-flop 67 and the output data from the flip-flop 68 and outputs the lower 6 bits of the addition result.

In FIG. 7(b) are shown: an input terminal 70a for receiving the count data outputted from the output terminal 60e of the selecting circuit 23; an input terminal 70b for receiving the 6-bit data outputted from the encoder 15b; an input terminal 70c for receiving the pulse signal to be measured; and an output terminal 70d from which data on the operation result is outputted. In the drawing are also shown: 6-bit flip-flops 71 and 72; an adder 73 for adding up the two sets of inputted 6-bit data to obtain 7-bit data and outputting the upper 2 bits of the 7-bit data and the lower 5 bits thereof separately; a data converting circuit 74 for outputting 6-bit data in which the lower 2 bits are occupied by the inputted 2-bit data and the upper 4 bits are "0"; an adder 75 for adding up the two sets of inputted 6-bit data to output 7-bit data; a flip-flop 76 for outputting 12-bit data in which the upper 7 bits are occupied by the inputted 7-bit data and the lower 5 bits are occupied by the inputted 5-bit data; a 12-bit flip-flop 77; and a subtracter 78 for calculating the absolute value of a difference between the two sets of inputted 12-bit data.

A description will be given to the operations of the selecting circuit 23 and of the time-difference operating circuit 14. It is assumed here that the current position of signal transition is in the 32nd inverter of the inverter ring 11 and that the number of circulations of signal transition around the inverter ring 11 is 1 (corresponding to TIME 64 in FIG. 3).

When the current position of signal transition is in the 32nd inverter, the output data from the encoder 13 is "011111", which is inputted to the input terminal 70b of the time-difference operating circuit 14. The 2-bit select signal outputted from the encoder 13b is inputted to the input terminal 60a of the selecting circuit 23. As shown in FIG. 5, if the current position of signal transition is in the 32nd inverter, the second counter 22a is selected and the count data is not corrected. Consequently, the lower bit of the select signal is "1" and the upper bit thereof is "0" (the lower bit of the select signal is "1" when the second counter 22a is selected and "0" when the first counter 21a is selected. The upper bit of the select signal is "1" when the count data is corrected and "0" when the count data is not corrected).

To the input terminal 60b of the selecting circuit 23 is inputted the count data "000001" from the first counter 21a. To the input terminal 60c thereof is inputted the count data "000001" from the second counter 22a. The selector circuit 66 selectively outputs the count data "000001" from the second counter 22a based on the lower bit of the select signal. The adder 69 adds up corrected 6-bit data "000000" obtained through conversion by the data converting circuit 65 and the count data "000001" selectively outputted from the selector circuit 66 and outputs 6-bit data "000001" obtained through the addition, which is outputted from the output terminal 60e.

The data outputted from the output terminal 60e of the selecting circuit 23 is inputted to the input terminal 70a of the time-difference operating circuit 14. The adder 73 adds up the data "000001" inputted to the input terminal 70a and the output data "011111" from the encoder 13b which has been inputted to the input terminal 70b. The addition result obtained is "0100000", of which the upper 2 bits "01" are outputted from an output terminal $q_1$ and the lower 5 bits "00000" are outputted from an output terminal $q_2$. The adder 75 adds up the upper data of the addition result which has been converted to 6-bit data "000001" by the data converting circuit 74 and the data "000001" inputted to the input terminal 70a and outputs 7-bit data "0000010" obtained through the addition.

The flip-flop 76 outputs 12-bit data "000001000000" in which the upper 7 bits are occupied by the 7-bit data outputted from the adder 75 and the lower 5 bits are occupied by the 5-bit data outputted from the output terminal $q_2$ of the adder 73. The 12-bit data obtained coincides with the time data shown in FIG. 3. The difference between the two sets of time data, i.e., data on the time difference representing the pulse spacing is provided by the subtracter 78 and outputted from the output terminal 70d.

Thus, according to the present embodiment, the provision of the two counter circuits eliminates a mishold in the counter-output holding circuit, so that the occurrence of an error in the upper-bit data of the time data can be prevented.

Although the present embodiment has used the two counter circuits, additional counter circuits may be provided in accordance with the number of the inverters included in the inverter ring. The time counting circuit in the present embodiment, which has been obtained by adding a plurality counter circuits to the time counting circuit in the first embodiment, can also be applied to a conventional time counting circuit.

According to the present embodiment, high-accuracy time data can be obtained even in a time counting circuit wherein the delay time for one delay circuit is 1 ns or less, the application of which is being examined by the present inventors.

(Third Embodiment)

Figure 8:
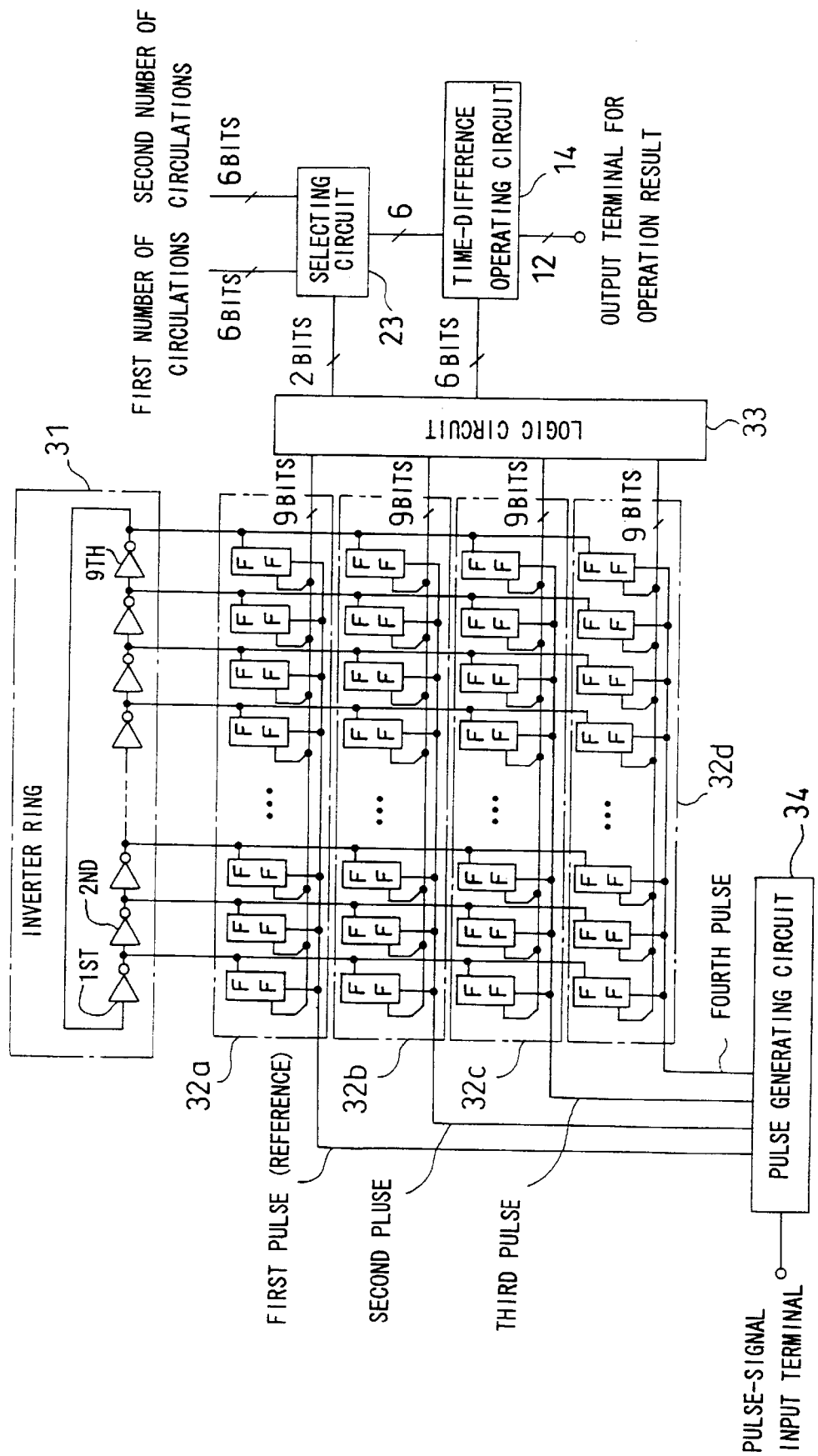
FIG. 8 shows the structure of a time counting circuit according to a third embodiment of the present invention.

FIG. 8 partially shows the structure of a time counting circuit according to a third embodiment of the present invention. In the drawing are shown: an inverter ring (IR) 31 as a delay circuit ring; a row of reference holding circuits 32a; a first row of subordinate holding circuits 32b; a second row of subordinate holding circuits 32c; a third row of subordinate holding circuits 32d; a logic circuit 33 as a signal converting means; and a pulse generating circuit 34. The selecting circuit 23 and time-difference operating circuit 14 have the same structures as shown in FIG. 4. The pulse-signal input terminal receives a pulse signal to be measured. The operation-result output terminal outputs time corresponding to the pulse spacing of the inputted pulse signal. The counter circuit and resetting circuit are not shown in the drawing.

The inverter ring 31 has substantially the same structure as the inverter ring 11 shown in FIGS. 1 and 4 except that the inverter ring 31 is composed of nine inverters. Each of the row of reference holding circuits 32a and the first to third rows of subordinate holding circuits 32b, 32c, and 32d are composed of nine flip-flops (FFs) connected to respective output terminals of all the inverters composing the inverter ring 31.

The logic circuit 33 performs a logic operation based on 9-bit data outputted from each row of holding circuits, outputs the lower-bit data of time data to the time-difference operating circuit 14, while outputting a select signal to the selecting circuit 23. The selecting circuit 23 selects, based on the select signal, either one of first and second numbers of circulations and outputs the selected one as the upper-bit data of the time data to the time-difference operating circuit 14.

The pulse generating circuit 34 outputs, based on the inputted pulse signal to be measured, a first pulse signal as a reference pulse signal and second to fourth pulse signals. The first pulse signal is inputted to each of the flip-flops composing the row of reference holding circuits 32a. Likewise, the second pulse signal is inputted to each of the flip-flops composing the first row of subordinate holding circuits 32b. The third pulse signal is inputted to the second row of subordinate holding circuits 32c. The fourth pulse signal is inputted to the third row of subordinate holding circuits 32d.

A description will be given below to the operation of the time counting circuit shown in FIG. 8.

Of the four pulse signals outputted from the pulse generating circuit 34, the first pulse signal changes with the same timing with which the inputted pulse signal to be measured changes. The second pulse signal is lagging behind the first pulse signal by $NT_d+T_d/4$. The third pulse signal is lagging behind the first pulse signal by $NT_d+T_d/2$. The fourth pulse signal is lagging behind the first pulse signal by $NT_d+3\ T_d/4$. Here, N is an integer equal to or more than 1 and $T_d$ is a delay time for one of the inverters composing the inverter ring 31.

Figure 9:
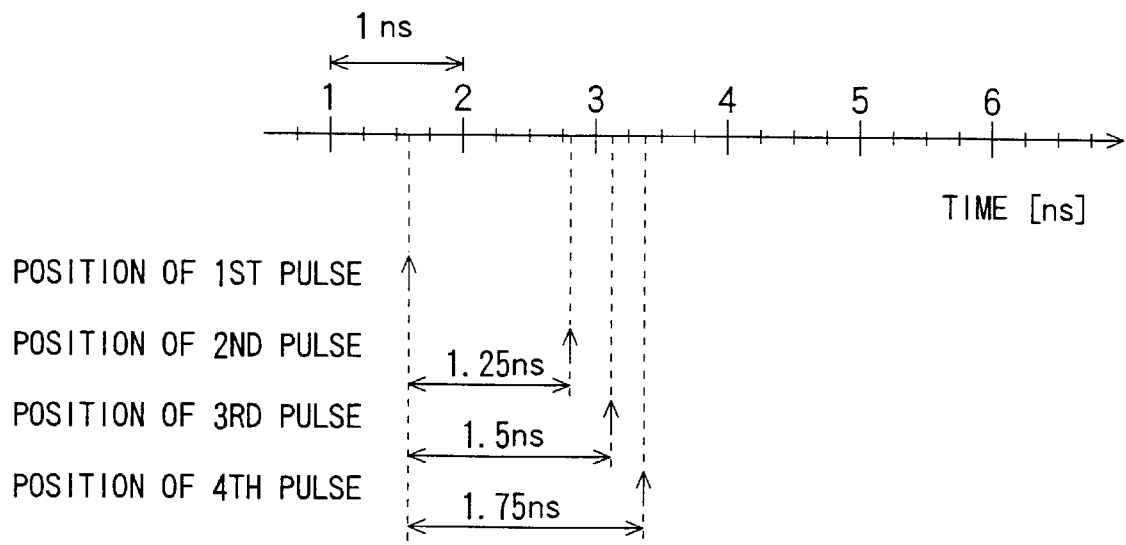

FIG. 9(a) shows differences between timings for the first to fourth pulse signals, in which N=1 and $T_d$=1 ns are satisfied. Specifically, the second pulse signal is delayed by 1.25 ns, the third pulse signal is delayed by 1.5 ns, and the fourth pulse signal is delayed by 1.75 ns.

It is assumed that the first signal rises between 1.5 ns and 1.75 ns. In this case, signals outputted from the row of reference holding circuits 32a represent 1 ns, which indicates that time data according to the first pulse signal is 1 ns. The second pulse signal rises between 2.75 ns and 3.0 ns. The third pulse signal rises between 3.0 ns and 3.25 ns. The fourth pulse signal rises between 3.25 ns and 3.5 ns. Consequently, the time represented by signals outputted from first row of subordinate holding circuits 32b becomes 2 ns, while the time represented by signals outputted from the second and third rows of subordinate holding circuits 32c and 32d becomes 3 ns. Consequently, the time data according to the second pulse signal is 2 ns, while the time data according to the third or fourth pulse signal is 3 ns.

The accuracy of the time data according to the first pulse signal can be increased based on the time data according to the second to fourth pulse signals. FIG. 9(b) illustrates the method of increasing the accuracy of the time data according to the first pulse signal. For example, in the case where all the sets of time data according to the second to fourth pulse signals are smaller than 3 ns, it can be judged that the first pulse signal has risen between 1.0 ns and 1.25 ns, so that the time data according to the first pulse signal is 1.0 ns. On the other hand, in the case where the time data according to the second pulse signal is smaller than 3 ns and the sets of time data according to the third and fourth pulse signals are larger than 3 ns (in the case shown in FIG. 9(a)), it can be judged that the first pulse signal has risen between 1.5 ns and 1.75 ns, so that the time data according to the first pulse signal is 1.5 ns. Such judgement can be made by the logic circuit 33.

Through such operations, time data representing time in increments of 0.25 ns can be provided even when the delay time per inverter is 1 ns. In other words, the time resolution can be quadrupled. Although the number of the inverters included in the inverter ring 31 is nine, the number of bits in the lower-bit data of the time data becomes six similarly to the time counting circuit shown in FIG. 1, since 9×4=36 sets of data can be obtained in one circulation of signal transition around the inverter ring 31.

As described above, according to the present embodiment, time data representing time in a unit smaller than the delay time for one of the inverters composing the inverter ring can be provided. Moreover, since the number of the inverters is by far smaller in the present embodiment than in the conventional time counting circuit, the power consumption of the entire circuit can be reduced significantly.

In the present invention, the number of the rows of holding circuits is not limited to four but a given number of rows of holding circuits can be provided in accordance with the signal delay time for one delay circuit and with the accuracy of time data desired.

(Fourth Embodiment)

Figure 10:
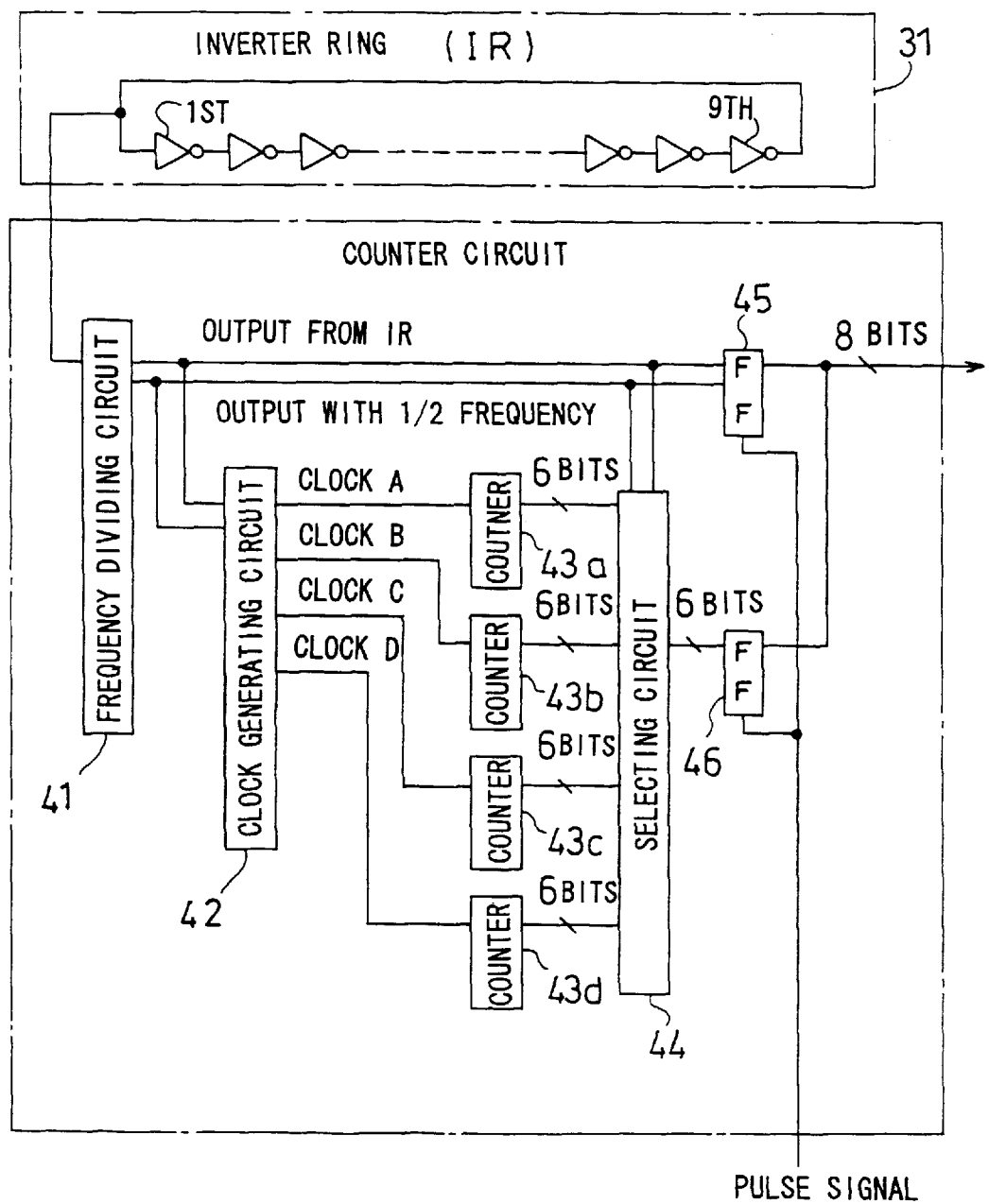
FIG. 10 shows the structure of a counter circuit in a time counting circuit according to a fourth embodiment of the present invention.

FIG. 10 shows the structure of a counter circuit in a time counting circuit according to a fourth embodiment of the present invention, in which are shown: an inverter ring (IR) 31 which is the same as shown in FIG. 8; a frequency dividing circuit 41; a clock generating circuit 42; counters 43a, 43b, 43c, and 43d; a selecting circuit 44; and rows of holding circuits 45 and 46, all of which constitute the counter circuit. The rows of holding circuits 45 and 46 constitute a count-data holding circuit.

Figure 11:
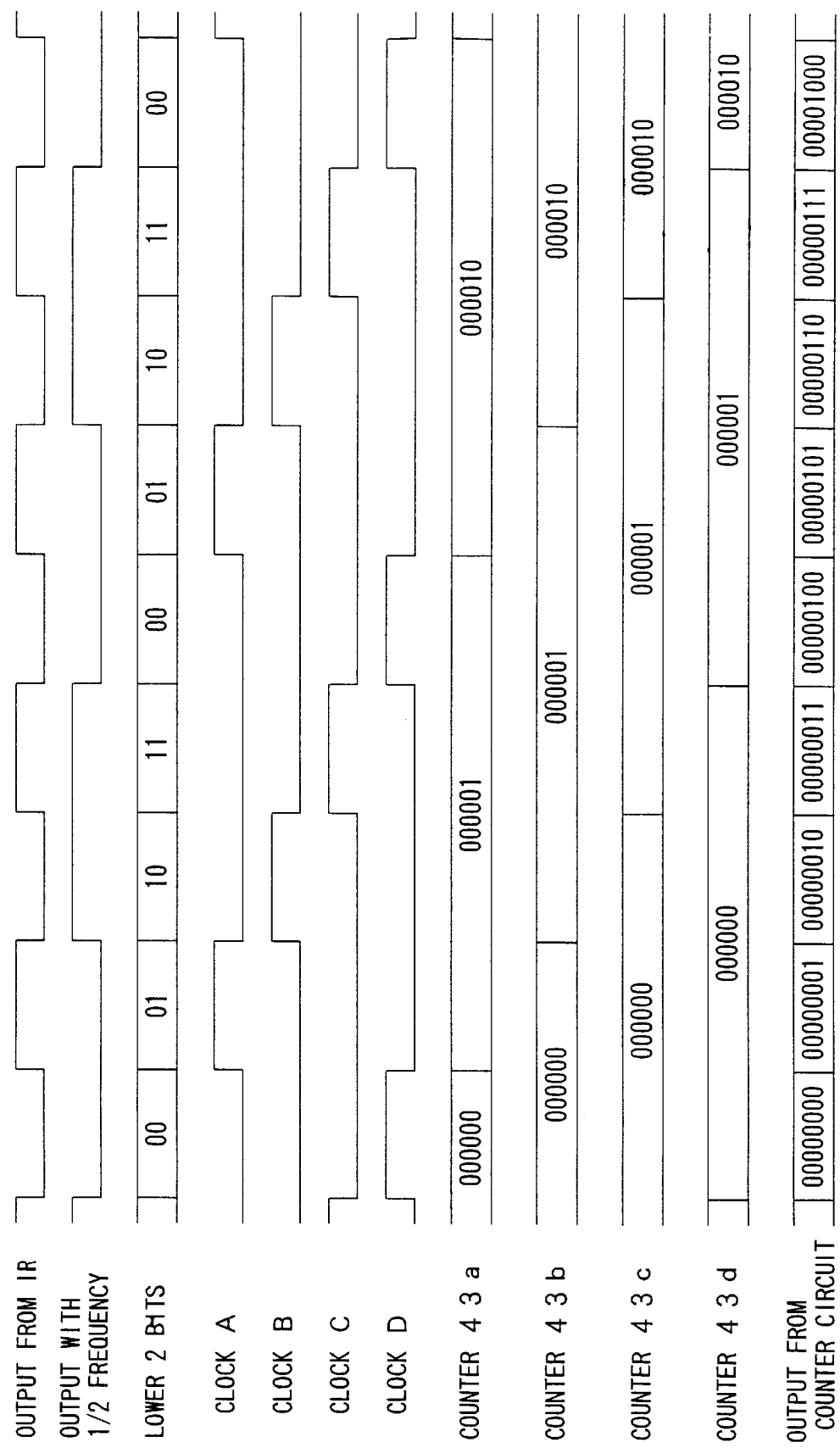
FIG. 11 illustrates the operation of the foregoing counter circuit.
Figure 12:
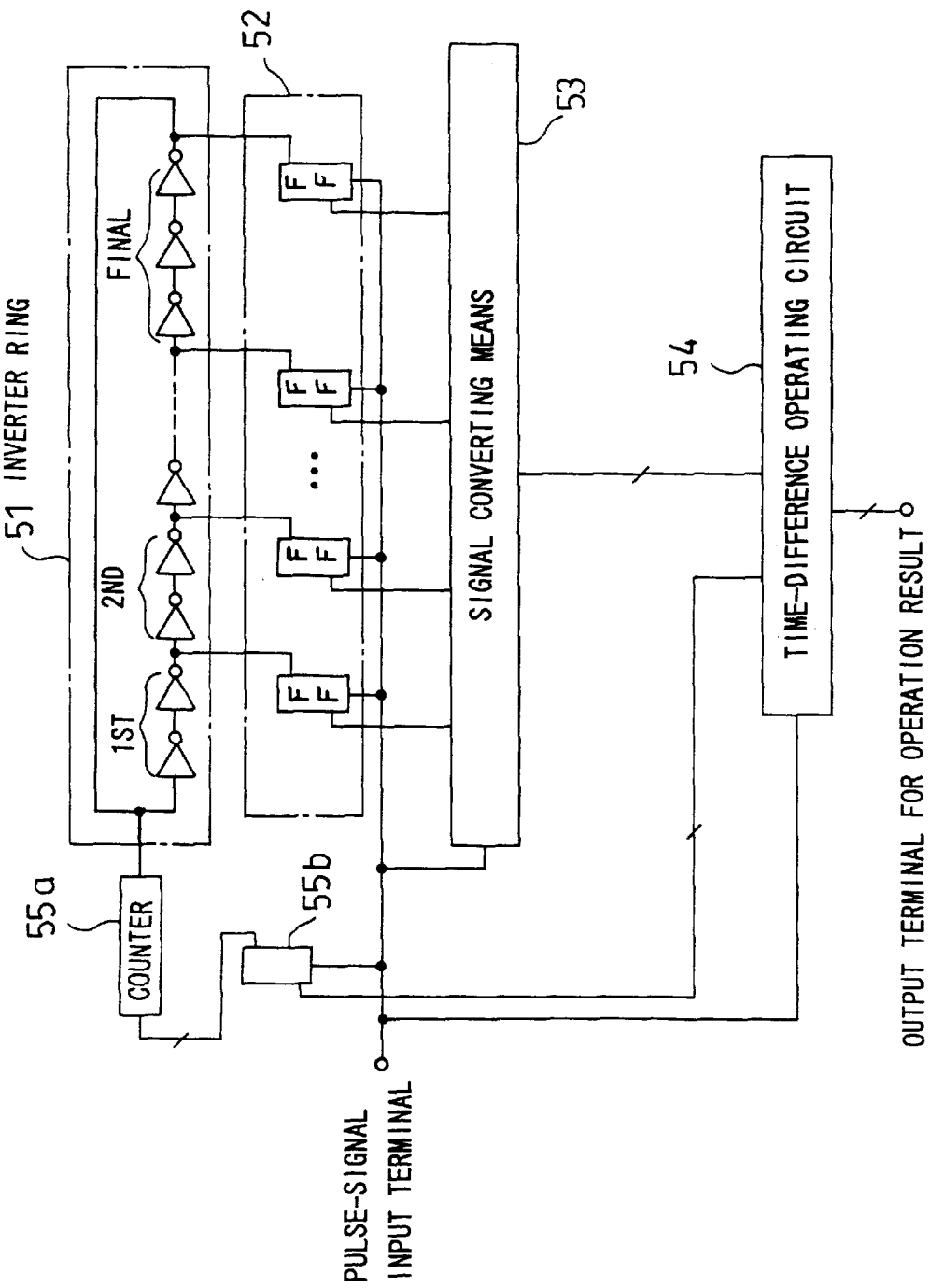
FIG. 12 shows the structure of a conventional time counting circuit.

Referring now to FIG. 11, a description will be given to the operation of the counter circuit shown in FIG. 10.

The frequency dividing circuit 41 receives an output signal from the 9th inverter of the inverter ring 31 (hereinafter referred to as an IR output signal) and generates a ½ divided-frequency clock signal having a period double the period of the IR output signal. The frequency dividing circuit 41 also outputs 2-bit data in which the lower bit is occupied by data represented by the IR output signal and the upper bit is occupied by data represented by the ½ divided-frequency clock signal.

The clock generating circuit 42 generates four clock signals as shown in FIG. 11 based on the 2-bit data outputted from the frequency dividing circuit 41. Of the four clock signals, the clock A is a signal which is on the HIGH level only when the 2-bit data is "01", the clock B is a signal which is on the HIGH level only when the 2-bit data is "10", the clock C is a signal which is on the HIGH level only when the 2-bit data is "11", and the clock D is a signal which is on the HIGH level only when the 2-bit data is "00".

The counters 43a, 43b, 43c, and 43d output 6-bit count data, similarly to the counter 15a shown in FIG. 1. The counter 43a counts the number of rising edges of the clock A. The counters 43a, 43b, and 43c counts the numbers of respective rising edges of the clocks A, B, C, and D. Briefly, each of the counters counts once every time the IR output signal makes four transitions, while maintaining specified time differences therewith. The count data from each of the counters is inputted to the selecting circuit 44.

The selecting circuit 44 selects one of the respective sets of count data from the counters based on the 2-bit data outputted from the frequency dividing circuit 41. When the 2-bit data is "00", the count data from the counter 43a is selected. When the 2-bit data is "01", the count data from the counter 43b is selected. When the 2-bit-data is "10", the count data from the counter 43c is selected. When the 2-bit data is "11", the count data from the counter 43d is selected.

The count data selected by the selecting circuit 44 is held by the row of holding circuits 46. The 2-bit data outputted from the frequency dividing circuit 41 is held by the row of holding circuits 45. When the pulse signal to be measured received from the outside rises, the counter circuit outputs 8-bit data in which the lower 2 bits are occupied by the 2-bit data held in the row of holding circuits 45 and the upper 6 bits are occupied by the 6-bit data held in the row of holding circuits 46.

Since the number of inverters composing the inverter ring 31 is nine, 4-bit lower-bit data can be obtained. Consequently, 12-bit time data can be provided, similarly to the time counting circuit shown in FIG. 1, which enables time to be counted in 2304 (9 stages×$2^8$) tones.

Thus, the counter circuit in the present embodiment can count clock signals having a period quadruple the period that can be counted by the counter provided therein. By using the counter circuit, circulation number data can be provided with accuracy even when the time required for one circulation of signal transition around the inverter ring of the time counting circuit is reduced.

According to the present embodiment, therefore, it becomes possible to drastically reduce power consumption by reducing the number of inverters, compared with the conventional time counting circuit. Moreover, even if time resolution is to be improved by reducing the signal delay time, it is no more necessary to increase the number of inverters, which prevents an increase in power consumption.

We claim:

1. A time counting circuit, comprising:
    a delay circuit ring composed of an odd number of delay circuits having identical structures and connected in a ring, wherein a first signal circulates around the delay circuit ring and transitions from one binary state to another binary state at each delay circuit; and
    means for converting data obtained from output signals of all of said delay circuits to time data based on a binary system.

2. A time counting circuit comprising:
    a delay circuit ring composed of a plurality of delay circuits, wherein a first signal circulates around the delay circuit ring and transitions from one binary state to another binary state at each delay circuit; and
    a counter circuit for counting the number of signal transitions at an output terminal of one of the delay circuits as the number of circulations of the first signal around said delay circuit ring, wherein said counter circuit comprises a plurality of counters for generating, based on a signal at the output terminal of said one delay circuit, a plurality of signals each having a period longer than a period of said signal at the output terminal of said one delay circuit and a time difference with respect to said signal at the output terminal of said one delay circuit, to count transitions of the generated signals by means of the respective counters, and to provide the number of circulations of the first signal around said delay circuit ring based on count data from each of the counters.

3. A time counting circuit for measuring pulse spacing of an input pulse signal, comprising:
    a delay circuit ring composed of an odd number of delay circuits having identical structures and connected in a ring, wherein a first signal circulates around the delay circuit ring and transitions from one binary state to another binary state at each delay circuit;
    a holding circuit row composed of a plurality of holding circuits connected to respective output terminals of all the delay circuits, wherein said holding circuit row receives the input pulse signal and outputs signals at the respective output terminals of the delay circuits on a rising edge of said input pulse signal;
    a signal converting means for converting the signals output from said holding circuit row to numeric data and outputting the numeric data; and
    a time-difference operating circuit for correcting the numeric data to provide time data, and calculating a pulse spacing of said input pulse signal based on said time data.

4. The time counting circuit according to claim 3, further comprising:
    a counter circuit connected to the output terminal of one of the delay circuits for counting the number of signal transitions at the output terminal of said one delay circuit as the number of circulations of the first signal around said delay circuit ring, said counter circuit receives said input pulse signal and outputs said number of circulations on the rising edge of said input pulse signal, wherein the time-difference operating circuit corrects the numeric data output from the signal converting means based on the number of first signal circulations output from said counter circuit to provide the time data.

5. The time counting circuit according to claim 4, wherein
said delay circuit ring is composed of ($2^n$+1) delay circuits (n is a positive integer),
said signal converting means converts the signals output from said holding circuit row to (n+1)-bit binary data and outputs the (n+1)-bit binary data,
said counter circuit outputs said number of circulations as binary data, and
said time-difference operating circuit adds the binary data output from said counter circuit to the (n+1)-bit binary data output from said signal converting means to provide first data, multiplies the binary data output from said counter circuit by $2^n$ to provide second data, and adds said first data to said second data to provide the time data.

6. The time counting circuit according to any one of claims 3 to 5, wherein the delay circuits are composed of inverters having identical structures.

7. The time counting circuit according to claim 4, wherein said counter circuit comprises:
a frequency dividing circuit for receiving the signal at the output terminal of said one delay circuit and generating a divided-frequency clock signal having a period twice that of said signal;
a clock generating circuit for receiving the signal at the output terminal of said one delay circuit and the divided-frequency clock signal, and for generating a plurality of subordinate clock signals having periods equal to the period of said divided-frequency clock signal and timings different from those of said divided-frequency clock signal;
a plurality of counters for counting the numbers of rising or falling edges of said plurality of subordinate clock signals and outputting the counts as plural sets of subordinate data;
a selecting circuit for receiving said plural sets of subordinate data, the signal at the output terminal of said one delay circuit, and the divided-frequency clock signal, for selecting one of said plural sets of subordinate data based on the signal at the output terminal of said one delay circuit and based on the divided-frequency clock signal, and for outputting the selected one of said plural sets of subordinate data as provisional count data; and
a count-data holding circuit for receiving said input pulse signal, the signal at the output terminal of said one delay circuit, the divided-frequency clock signal, and the provisional count data, and for outputting, as said number of circulations, count data in which a least significant bit is occupied by data obtained by converting the signal at the output terminal of said one delay circuit, a second least significant bit is occupied by data obtained by converting said divided-frequency clock signal, and upper bits are occupied by said provisional count data, and outputting said count data on the rising edge of said input pulse signal.

8. The time counting circuit according to claim 3, wherein the signal converting means for generating a select signal based on the signals output from the holding circuit row, said time counting circuit further comprising:
a first counter circuit connected to the output terminal of one of the delay circuits for counting the number of signal transitions at the output terminal of said one delay circuit as a first number of circulations of the first signal around said delay circuit ring, said first counter circuit receiving the input pulse signal and outputting said first number of circulations on the rising edge of said input pulse signal;
a second counter circuit connected to the output terminal of another of the delay circuits for calculating the number of signal transitions at the output terminal of said other delay circuit as a second number of circulations of the first signal around said delay circuit ring, said second counter circuit receiving said input pulse signal and outputting said second number of circulations on the rising edge of said input pulse signal; and
a selecting circuit for receiving said first and second numbers of circulations and said select signal, for selecting either one of said first and second numbers of circulations as circulation number data based on said select signal, and for outputting the selected one of said first and second numbers of circulations to the time-difference operating circuit, wherein
said time-difference operating circuit corrects the numeric data output from said signal converting means based on the circulation number data output from said selecting circuit.

9. The time counting circuit according to claim 8, wherein said signal converting means outputs, to said selecting circuit, the select signal which directs selection of said second number of circulations when a current position of the first signal passes through a first specified delay circuit and which directs selection of said first number of circulations when a current position of the first signal passes through a second specified delay circuit.

10. The time counting circuit according to claim 3, further comprising:
a pulse generating circuit for receiving the input pulse signal and generating a plurality of subordinate pulse signals corresponding to said input pulse signal and having time differences with respect to said input pulse signal; and
a plurality of subordinate holding circuit rows each composed of a plurality of holding circuits connected to the respective output terminals of all the delay circuits, said subordinate holding circuit rows receiving said subordinate pulse signals and outputting signals at the respective output terminals of the delay circuits on rising edges of said subordinate pulse signals, wherein
the signal converting means for converting, with reference to the signals output from said subordinate holding circuit rows, the signals output from the holding circuit row to the numeric data which represents time in a unit smaller than a signal delay time for each of the delay circuits and outputting the numeric data.

11. The time counting circuit according to claim 3, wherein said signal converting means includes an inverting circuit row composed of inverting circuits connected to respective output terminals of every other holding, said signal converting means converting signals output from said inverting circuit row and the signals output from holding circuits to which inverting circuits are not connected to the numeric data, and outputting the numeric data.

12. A time counting circuit for measuring pulse spacing of an input pulse signal, comprising:
a delay circuit ring composed of a plurality of delay circuits connected in a ring, wherein a first signal circulates around the delay circuit ring and transitions from one binary state to another binary state at each delay circuit;

a holding circuit row composed of a plurality of holding circuits connected to respective output terminals of the delay circuits, said holding circuit row receiving said input pulse signal and outputting signals at the respective output terminals of the delay circuits on a rising edge of said input pulse signal;

a signal converting means for converting the signals output from said holding circuit row to numeric data, outputting the numeric data, and generating a select signal based on the signals output from said holding circuit row;

a first counter circuit connected to the output terminal of one of the delay circuits for counting the number of first signal transitions at the output terminal of said one delay circuit as a first number of circulations of the first signal around said delay circuit ring, said first counter circuit receiving said input pulse signal and outputting said first number of circulations on the rising edge of said pulse;

a second counter circuit connected to the output terminal of another of the delay circuits for counting the number of first signal transitions at the output terminal of said other delay circuit as a second number of circulations of the first signal around said delay circuit ring, said second counter circuit receiving said input pulse signal and outputting said second number of circulations on the rising edge of said input pulse signal;

a selecting circuit for receiving said first and second numbers of circulations and said select signal, for selecting either one of said first and second numbers of circulations based on said select signal, and for outputting the selected one of said first and second numbers of circulations as circulation number data; and a time-difference operating circuit for providing time data based on the numeric data output from said signal converting means and based on the circulation number data output from said selecting circuit, and for calculating the pulse spacing of said input pulse signal based on said time data.

13. The time counting circuit according to claim 8 or 12, wherein said first counter circuit comprises:

a first frequency dividing circuit for receiving the signal at the output terminal of said one delay circuit and generating a first divided-frequency clock signal having a period twice that of said signal;

a first clock generating circuit for receiving the signal at the output terminal of said one delay circuit and said first divided-frequency clock signal, and for generating a plurality of first subordinate clock signals having periods equal to the period of said first divided-frequency clock signal and timings different from those of said first divided-frequency clock signal;

a plurality of first counters for counting the numbers of rising or falling edges of said plurality of first subordinate clock signals and outputting the counts as plural sets of first subordinate data;

a first selecting circuit for receiving said plural sets of first subordinate data, the signal at the output terminal of said one delay circuit, and the first divided-frequency clock signal, for selecting one of said plural sets of first subordinate data based on the signal at the output terminal of said one delay circuit and based on the first divided-frequency clock signal, and for outputting the selected one of said plural sets of first subordinate data as first provisional count data; and a first count-data holding circuit for receiving said input pulse signal, the signal at the output terminal of said one delay circuit, the first divided-frequency clock signal, and the first provisional count data, and for outputting, as said first number of circulations, first count data in which a least significant bit is occupied by data obtained by converting the signal at the output terminal of said one delay circuit, a second least significant bit is occupied by data obtained by converting said first divided-frequency clock signal, and upper bits are occupied by said first provisional count data, and outputting said first count data on the rising edge of said input pulse signal; and said second counter circuit comprises:

a second frequency dividing circuit for receiving the signal at the output terminal of said other delay circuit and generating a second divided-frequency clock signal having a period twice that of said signal;

a second clock generating circuit for receiving the signal at the output terminal of said other delay circuit and said second divided-frequency clock signal, and for generating a plurality of second subordinate clock signals having periods equal to the period of said second divided-frequency clock signal and timings different from those of said second divided-frequency clock signal;

a plurality of second counters for counting the numbers of rising or falling edges of said plurality of second subordinate clock signals and outputting the counts as plural sets of second subordinate data;

a second selecting circuit for receiving said plural sets of second subordinate data, the signal at the output terminal of said other delay circuit, and the second divided-frequency clock signal, for selecting one of said plural sets of second subordinate data based on the signal at the output terminal of said other delay circuit and based on the second divided-frequency clock signal, and for outputting the selected one of said plural sets of second subordinate data as second provisional count data; and a second count-data holding circuit for receiving said input pulse signal, the signal at the output terminal of said other delay circuit, the second divided-frequency clock signal, and the second provisional count data, and for outputting, as said second number of circulations, second count data in which a least significant bit is occupied by data obtained by converting the signal at the output terminal of said other delay circuit, a second least significant bit is occupied by data converting said second divided-frequency clock signal, and upper bits are occupied by said second provisional count data, and outputting said second count data on the rising edge of said input pulse signal.

14. A time counting circuit for measuring pulse spacing of an input pulse signal, comprising:

a delay circuit ring composed of a plurality of delay circuits connected in a ring, wherein a first signal circulates around the delay circuit ring and transitions from one binary state to another binary state at each delay circuit;

a pulse generating circuit for receiving the input pulse signal and generating a plurality of subordinate pulse signals corresponding to said input pulse signal and having time differences with respect to said input pulse signal;

a reference holding circuit row composed of a plurality of holding circuits connected to respective output terminals of the delay circuits, said reference holding circuit row receiving said input pulse signal and outputting signals at the respective output terminals of the delay circuits on a rising edge of said input pulse signal;

a plurality of subordinate holding circuit rows each composed of a plurality of holding circuits connected to the respective output terminals of the delay circuits, said subordinate holding circuit rows receiving said plurality of subordinate pulse signals and outputting the signals at the respective output terminals of the delay circuits on rising edges of said subordinate pulse signals; and a signal converting means for converting, with reference to the signals output from said subordinate holding circuit rows, signals output from said reference holding circuit row to numeric data which represents time in a unit smaller than a signal delay time for each of said delay circuits and outputting the numeric data.

15. The time counting circuit according to claim 14, wherein said delay circuit ring is composed of A delay circuits (A is a natural number equal to or more than 2) for each of which the signal delay time is T, said pulse generating circuit generates a first pulse signal corresponding to the input pulse signal, generates a second pulse signal corresponding to said input pulse signal and having a time difference of NT+T/4 (N is a positive integer) with respect to the input pulse signal, generates a third pulse signal corresponding to said input pulse signal and having a time difference of NT+2 T/4 with respect to the input pulse signal, and generates a fourth pulse signal corresponding to said input pulse signal and having a time difference of NT+3 T/4 with respect to the input pulse signal, said reference holding circuit row receiving said first pulse signal and outputting, as reference signals, the signals at the respective output terminals of the delay circuits on a rising edge of said first pulse signal, said subordinate holding circuit rows comprising:

a first subordinate holding circuit row receiving said second pulse signal and outputting, as first subordinate signals, the signals at the respective output terminals of the delay circuits on a rising edge of said second pulse signal;

a second subordinate holding circuit row receiving said third pulse signal and outputting, as second subordinate signals, the signals at the respective output terminals of the delay circuits on a rising edge of said third pulse signal; and a third subordinate holding circuit row receiving said fourth pulse signal and outputting, as third subordinate signals, the signals at the respective output terminals of the delay circuits on a rising edge of said fourth pulse signal; and said signal converting means for receiving said reference signals and said first to third subordinate signals, and for converting, when numeric data represented by said reference signals is n (n is an integer equal to or more than 1 and equal to or less than A), (i) the numeric data represented by said reference signals to n when said first subordinate signals represent n+N−kA (k is an integer equal to or more than 0), said second subordinate signals represent n+N−kA, and said third subordinate signals represent n+N−kA, (ii) the numeric data represented by said reference signals to n+1/4 when said first subordinate signals represent n+N−kA, said second subordinate signals represent n+N−kA, and said third subordinate signals represent n+N−kA+1, (iii) the numeric data represented by said reference signals to n+2/4 when said first subordinate signals represent n+N−kA, said second subordinate signals represent n+N−kA+1, and said third subordinate signals represent n+N−kA+1, and (iv) the numeric data represented by said reference signals to n+3/4 when said first subordinate signals represent n+N−kA+1, said second subordinate signals represent n+N−kA+1, and said third subordinate signals represent n+N−kA+1.

16. A time counting circuit according to claim 14, further comprising:

a counter circuit connected to the output terminal of one of the delay circuits for counting the number of signal transitions at the output terminal of said one delay circuit as the number of circulations of the first signal around said delay circuit ring, said counter circuit receiving said input pulse signal and outputting said number of circulations on the rising edge of said input pulse signal, wherein said counter circuit comprises:

a frequency dividing circuit for receiving the signal at the output terminal of said one delay circuit and outputting a divided-frequency clock signal having a period twice that of said signal;

a clock generating circuit for receiving the signal at the output terminal of said one delay circuit and the divided-frequency clock signal, and for generating a plurality of subordinate clock signals having periods equal to the period of said divided-frequency clock signal and timings different from those of said divided-frequency clock signal;

a plurality of counters for counting the numbers of rising or falling edges of said plurality of subordinate clock signals and outputting the counts as plural sets of subordinate data;

a selecting circuit for receiving said plural sets of subordinate data, the signal at the output terminal of said one delay circuit, and said divided-frequency clock signal, for selecting one of said plural sets of subordinate data based on the signal at the output terminal of said one delay circuit and based on the divided-frequency clock signal, and for outputting the selected one of said plural sets of subordinate data as provisional count data; and a count-data holding circuit for receiving said input pulse signal, the signal at the output terminal of said one delay circuit, the divided-frequency clock signal, and the provisional count data, and for outputting, as said number of circulations, count data in which a least significant bit is occupied by data obtained by converting the signal at the output terminal of said one delay circuit, a second least significant bit is occupied by data obtained by converting said divided-frequency clock signal, and upper bits are occupied by said provisional count data, and outputting said count data on the rising edge of said input pulse signal.

17. A counter circuit for counting the number of transitions of a subject clock signal, comprising:

a frequency dividing circuit for receiving said subject clock signal and generating a divided-frequency clock signal having a period twice that of said clock signal;

a clock generating circuit for receiving said subject clock signal and the divided-frequency clock signal, and for outputting a plurality of subordinate clock signals having equal periods to the period of said divided-frequency clock signal and timings different from those of said divided-frequency clock signal;

a plurality of counters for counting the numbers of rising or falling edges of said plurality of subordinate clock signals and outputting the counts as plural sets of subordinate data;

a selecting circuit for receiving said plural sets of subordinate data, said subject clock signal, and said divided-frequency clock signal, for selecting one of said plural sets of subordinate data based on said subject clock signal and based on said divided-frequency clock signal, and for outputting the selected one of said plural sets of subordinate data as provisional count data; and a count-data holding circuit for receiving an input pulse signal, said subject clock signal, said divided-frequency clock signal, and said provisional count data, and for outputting count data in which a least significant bit is occupied by data obtained by converting said subject clock signal, a second least significant bit is occupied by data obtained by converting said divided-frequency clock signal, and upper bits are occupied by said provisional count data, and outputting said count data on a rising edge of said input pulse signal.

* * * * *